United States Patent
Wu

(10) Patent No.: US 9,907,199 B2
(45) Date of Patent: Feb. 27, 2018

(54) HIGH-POWER ELECTRONIC MODULE AND METHOD FOR MAKING SUCH A MODULE

(71) Applicant: Schneider Electric Industries SAS, Rueil Malmaison (FR)

(72) Inventor: Cong Martin Wu, Tarbes (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 131 days.

(21) Appl. No.: 14/845,736

(22) Filed: Sep. 4, 2015

(65) Prior Publication Data

US 2016/0073535 A1 Mar. 10, 2016

(30) Foreign Application Priority Data

Sep. 8, 2014 (FR) ..................................... 14 58390

(51) Int. Cl.
*H05K 7/10* (2006.01)
*H05K 7/06* (2006.01)
(Continued)

(52) U.S. Cl.
CPC ...... *H05K 7/1023* (2013.01); *H01L 23/49811* (2013.01); *H01L 23/49844* (2013.01);
(Continued)

(58) Field of Classification Search
CPC ........ H05K 7/1023; H05K 7/026; H05K 7/06; H05K 3/341; H01L 23/49811;
(Continued)

(56) References Cited

U.S. PATENT DOCUMENTS 6,072,240 A * 6/2000 Kimura ................. H01L 25/072
257/692
2008/0054439 A1* 3/2008 Malhan ............. H01L 23/49844
257/690
(Continued)

FOREIGN PATENT DOCUMENTS

DE 11 2012 003296 T5 5/2014
WO WO 2004/034428 A2 4/2004

OTHER PUBLICATIONS

French Preliminary Search Report dated May 26, 2015 in French Application 14 58390, filed on Sep. 8, 2014 (with English Translation of Categories of Cited Documents).

*Primary Examiner* — Jinhee Lee
*Assistant Examiner* — Rockshana Chowdhury
(74) *Attorney, Agent, or Firm* — Oblon, McClelland, Maier & Neustadt, L.L.P.

(57) ABSTRACT

A power electronic module including at least one pair of power electronic components, each pair including a first and a second component, each component including a first face, configured to be supported on a support and a second face configured to be electrically connected to an electrical circuit with a smaller thermal contact area than the contact area between the first face and the support, and a first and a second support. The first component in each pair is supported by the first support and is connected to a second electrical circuit of the second support and the second component in each pair is supported on the second support and is connected to a first electrical circuit of the first support.

6 Claims, 4 Drawing Sheets

(51) Int. Cl.
- *H05K 7/02* (2006.01)
- *H05K 3/34* (2006.01)
- *H01L 23/498* (2006.01)
- *H01L 23/00* (2006.01)
- *H01L 25/07* (2006.01)

(52) U.S. Cl.
CPC ........ *H01L 23/49861* (2013.01); *H01L 24/10* (2013.01); *H01L 25/071* (2013.01); *H05K 3/341* (2013.01); *H05K 7/026* (2013.01); *H05K 7/06* (2013.01); *H01L 2924/0002* (2013.01)

(58) Field of Classification Search
CPC ............. H01L 23/49861; H01L 25/071; H01L 23/49844; H01L 24/10; H01L 2924/0002
USPC ........................................................ 361/728
See application file for complete search history.

(56) References Cited

U.S. PATENT DOCUMENTS

| | | | |
|---|---|---|---|
| 2011/0024896 A1* | 2/2011 | Tsunoda | H01L 23/492 257/707 |
| 2013/0020694 A1 | 1/2013 | Liang et al. | |

* cited by examiner

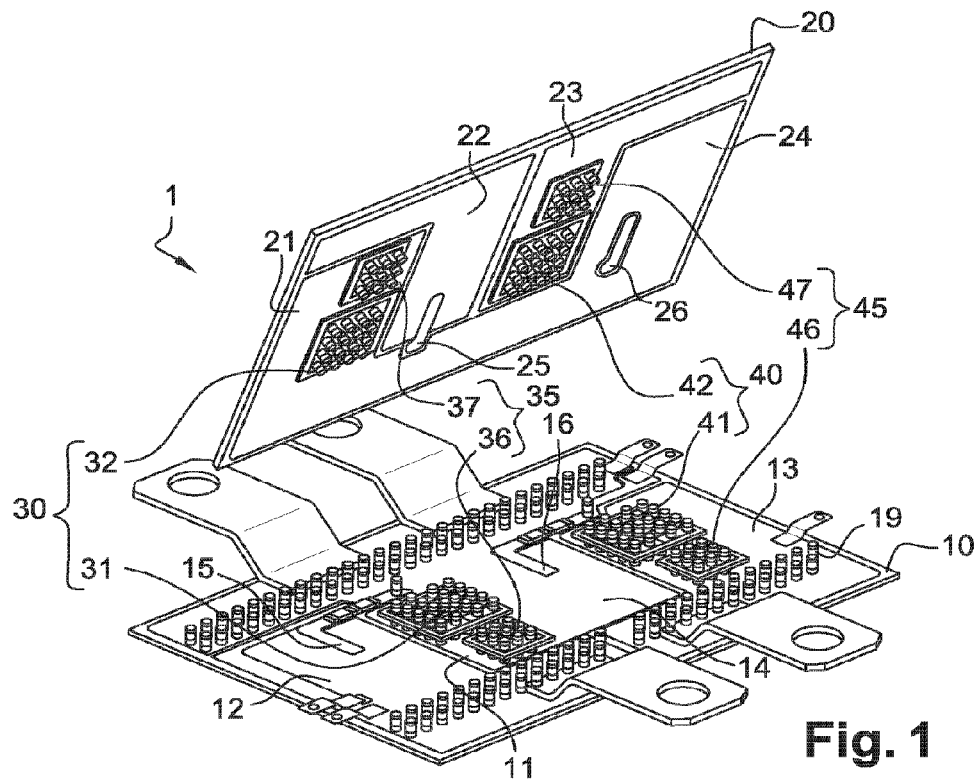
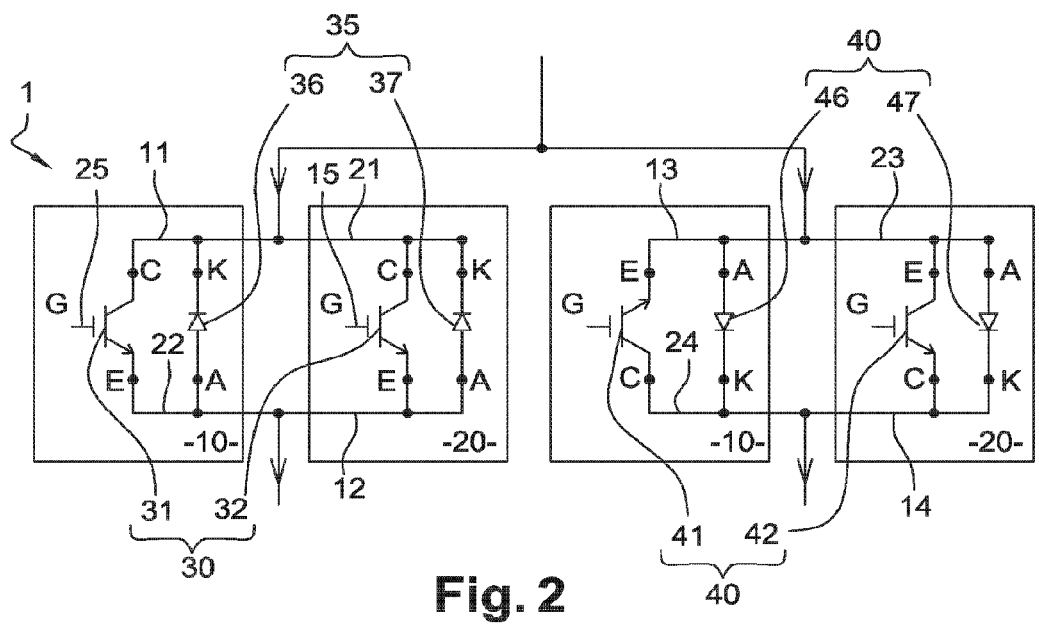
Fig. 1
Fig. 2

HIGH-POWER ELECTRONIC MODULE AND METHOD FOR MAKING SUCH A MODULE

TECHNICAL FIELD

The invention relates to the field of power electronic devices and more particularly power electronic modules.

STATE OF PRIOR ART

For the performance of some functions such as interrupting an electrical signal, it is known that medium and low voltage circuits can be fitted with power electronic devices such as power electronic modules. Each such power module may comprise a plurality of power electrical components such as diodes or insulated gate bipolar transistors (IGBT) arranged together to form an electrical sub-circuit of the equipped electrical circuit.

More precisely, such a power electronic module comprises a support to support components and to connect one of their power contacts and a connection plate to connect the other power contact of components and at least one of their control contacts when they have any, in addition to the plurality of components. In this way, components are integrated into a single module with two heat exchange surfaces to evacuate heat released by the components in operation, namely surfaces of the support and the connection plate.

Nevertheless, in such a configuration, most of the heat is evacuated through the support. The surface area of thermal contacts at connections between each component and the connection plate is much smaller than the surface area between each component and the support. The result is that the efficiency of heat removal is reduced and mechanical problems arise related to the temperature difference between the support and the connection plate and the resulting differential thermal expansion.

Document US2013/020694 A1 discloses how to produce a module comprising a first and a second support on which the electronic components are laid out in order to improve the temperature distribution and to optimise evacuation of heat released by components of electronic modules. In the layout of modules disclosed in this document, each component has a first face on which a first power contact is located and through which it is supported by one of the supports, and a second face on which a second power contact is located and through which it is connected to the other support. In such a module, components of the same type are connected in series with a first component supported on the first support and a second component supported on the second support. With this procedure, the first component has a preponderant thermal contact with the second support and the second component has a preponderant thermal contact with the second support.

The result is that such a module has two heat exchange surfaces to evacuate heat released by the components in operation with a relatively balanced heat distribution between the first and the second support.

Nevertheless, such a module has a number of disadvantages concerning the thermal distribution between the supports and allowable connections between components. The thermal distribution of such a module is not always genuinely balanced because there are often cases in which the two components do not operate symmetrically or in a balanced manner, which can cause a thermal unbalance. Furthermore, according to the principle presented in document US2013/020694 A1 there are tight constraints regarding the allowable electrical circuit because components necessarily have to be mounted in series in order to create a balanced heat distribution.

PRESENTATION OF THE INVENTION

The invention aims at solving these disadvantages and thus at supplying a power electronic module that does not restrict allowable electrical circuits, while having a configuration that facilitates balanced removal of heat regardless of the operating configuration.

The invention relates to a power electronic module comprising:
  a plurality of power electronic components, each component comprising a first face attempt to be supported on a support in electrical contact with an electrical circuit of the support, and a second face that attempt to be electrically connected to another electrical circuit with a smaller thermal contact area than the contact area between the first face and the support,
  a first and a second support arranged approximately parallel to each other and that comprise a first and a second electrical circuit respectively,
  at least some of the components are arranged in pairs each comprising a first and a second approximately identical component.

The two components in a pair have a redundant arrangement, the first component in the pair being supported by the first support and connected to the second electrical circuit, the second component being supported by the second support and being connected to the first electrical circuit so as to operate in parallel with the first component in said pair.

Such a module is capable of good removal of heat released during operation with a balanced thermal distribution between the first and the second support while leaving it possible to make a relatively complex connection between its different components. For each pair of components, the heat exchange surface area between the first component and the first support is practically identical to the heat exchange area between the second component and the second support, to provide a balanced distribution between the two supports considering that the first and second components are redundant and function in parallel. Furthermore, such a set up in no way limits circuits that can be used with such a module, since every component can be replaced by an equivalent pair of components operating in parallel.

In the above and throughout the remainder of this document, the expression "the first and second components have a redundant layout" means that the first component and the second component have an equivalent layout in which they operate in parallel and under practically identical conditions.

In the following and throughout the remainder of this document, the expression "so as to operate in parallel" means that the first component and the second component are mounted either directly in parallel with each other or in a circuit in which the first component and the second component are included in two equivalent branches of the circuit parallel to each other. Thus, such a configuration for example includes a circuit with two pairs of components in which the first components of the two pairs are in series with each other in parallel with the second components of the two pairs also in series with each other.

In the above and throughout the remainder of this document, the expression "approximately identical components" means that the components have identical characteristics within tolerances.

The first and the second component may be installed in parallel with each other.

Each component may be connected to the electrical circuit of the support that is not supporting them by means of solder bridges, for example such as can be obtained by ball soldering or brazing.

The first face of each component may be fixed to the support supporting it by solder or brazing material.

Such connection and attachment means enable a fast and reliable electrical connection of components to the conducting tracks and a firm mechanical attachment of components. A module comprising these two types of means can thus be easily manufactured and may have reliable electrical and thermal connections.

Each component of at least one pair may comprise at least one control contact and at least two power contacts, the control contact being located on the second face and at least one first power contact being located on the first face, the electrical circuit of each of the first and the second supports may include at least one first high power circuit conducting track called the power track and a control conducting track called the control track, and the components of the at least one pair may be arranged on the corresponding support with the power contact of the first face in contact with a high power track and with the control contact connected to a control track of the support on which the component is not supported.

With such a module configuration, the connection of one pair of components comprising a control contact, such as a controlled switch, is facilitated.

The control track of the first support may have a track portion facing the first power track of the second support and the control track of the second support may have a track portion facing the first power track of the first support.

With such a configuration, placement of a component which comprises a control contact on its second face, regrading the power and control tracks of the first and the second supports, is optimised.

The second power contact of each of the components which comprise a control contact may be arranged on the second face of the component, each of the first and second supports comprising at least one second power track, the components which comprise a control contact may have each the second control contact connected to the second power track of the support on which the component is not supported.

The second power track of the first support may comprise a track portion facing the first power track of the second support, the second power track of the second support comprising a track portion facing the first power track of the first support.

The invention also relates to a method of manufacturing an electronic power module comprising the following steps:
supply a first and a second support comprising a first and a second electrical circuit respectively,
supply a plurality of power electronic components each component comprising a first and a second face, at least part of the components being designed to be arranged in pairs, each comprising a first and a second approximately identical component,
installation of each first component on the first support so that its first face supported by the first support is in electrical contact with the first electrical circuit,
install each second component on the second support such that its first face supported by the second support is in electrical contact with the second electrical circuit,
assemble the first and the second support by electrically connecting the second face of each first component to a second electrical circuit of the second support and electrically connecting the second face of each second component to a first electrical circuit of the first support so as to operate in parallel with the corresponding first component, the two components in the same pair having a redundant layout.

The assembly steps of each first and second component on the first and second supports respectively may be a step to solder or braze each of said first and second components.

During the assembly step of the first and the second components, there may be a sub-step to install solder balls and a heating sub-step for ball soldering with said soldering balls.

Such methods can be used for the manufacture of modules according to the invention and therefore that benefit from the corresponding advantages.

BRIEF DESCRIPTION OF THE DRAWINGS

This invention will be better understood after reading the description of example embodiments given for guidance only and in no way limitative, with reference to the appended drawings in which:

FIG. 1 shows an example of a high power module according to the invention, in which a first and a second support are separated to show high power components mounted on each support, FIG. 2 diagrammatically shows the equivalent circuit of the module shown in FIG. 1, FIGS. 3A and 3B show the electrical circuit of a first and a second support of the module shown in FIG. 2 with the components that it supports, respectively, the components to which they are connected being represented by their contour, FIG. 4 diagrammatically shows the heat distribution during operation of the module shown in FIG. 1, FIGS. 5A to 5D show the main steps for manufacturing a module as shown FIG. 1, Identical, similar or equivalent parts of the different figures have the same numeric references to facilitate comparison between the different figures.

The different parts shown in the figures are not necessarily all shown at the same scale to make the figures more easily readable.

DETAILED PRESENTATION OF PARTICULAR EMBODIMENTS

FIG. 1 shows a perspective view of an electronic power module 1 according to the invention in which a first and a second support 10, 20 are separated in order to show the electronic power components 31, 32, 36, 37, 41, 42, 46, 47 that are arranged on these two supports 10, 20.

Figure 3B:
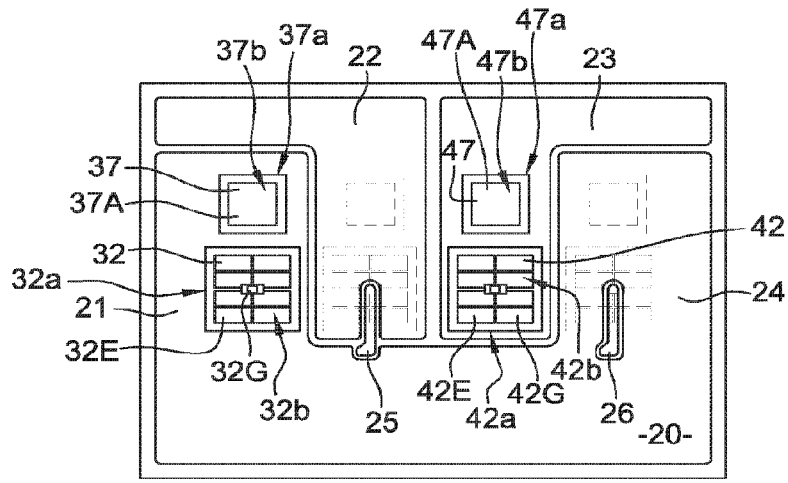
Figure 3A:
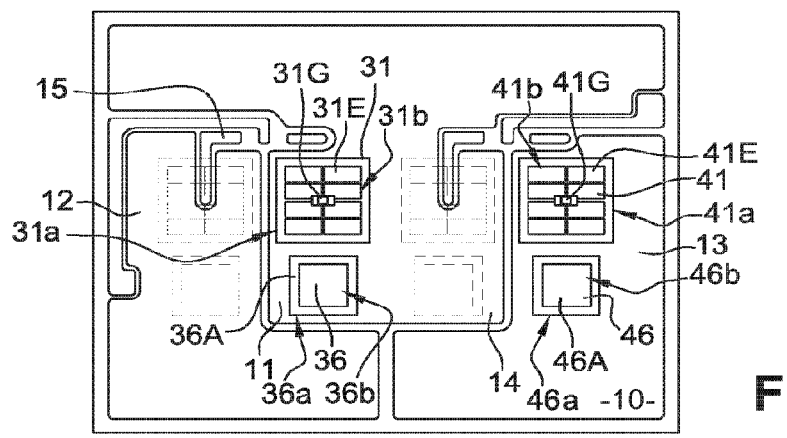

With reference to FIGS. 3A and 3B, such a module 1 comprises:
a first and a second support 10, 20 each comprising an electrical circuit on their inner face, in other words the face facing the other support 20, 10.
a plurality of pairs 30, 35, 40, 45 of components 31, 32, 36, 37, 41, 42, 46, 47, each of the pairs 30, 35, 40, 45 comprising a first and a second approximately identical component 31, 36, 41, 46, 32, 37, 42, 47 and each of the components 31, 32, 36, 37, 41, 42, 46, 47 comprising a first face 31a, 32a, 36a, 37a, 41a, 42a, 46a, 47a supported on the first support 10 for some 31, 36, 41, 46 and on the second support 20 for the others 32, 37, 42, 47, and a second face 31*b*, 32*b*, 36*b*, 37*b* connected to an electrical circuit of the second support 20 for the some and of the first support 10 for the others.

The two components 31, 32, 36, 37, 41, 42, 46, 47 of one pair 30, 35, 40, 45 have a redundant arrangement, the first component 31, 36, 41, 46 of said pair 30, 35, 40, 45 being supported by the first support 10 and connected to the second electrical circuit, the second component 32, 37, 42, 47 being supported by the second support 20 and connected to the first electrical circuit so as to operate in parallel with the first component 31, 36, 41, 46 of said pair 30, 35, 40, 45.

FIG. 2 diagrammatically shows the sub-circuit formed by the module 1 that reproduces a conventional configuration in which two switches are put in series, better known under its name "dual switch", in which each switch has been doubled up by two switches installed in parallel. Thus more precisely, the module 1 comprises:

a first and a second pair 30, 40 of IGBTs,
a first and a second pair 35, 45 of diodes associated with the first and the second pair 30,40 of IGBTs respectively.

The first face 31*a*, 32*a*, 41*a*, 42*a* of each IGBT 31, 32, 41, 42 comprises a first power contact 31C, 32C, 41C, 42C corresponding to the IGBT collector 31, 32, 41, 42. The first power contact 31C, 32C, 41C, 42C represents the largest part of the surface of the first face 31*a*, 32*a*, 41*a*, 42*a* of the IGBT 31, 32, 41, 42. The second face 31*b*, 32*b*, 41*b*, 42*b* of each IGBT 31, 32, 41, 42 comprises a second power contact 31E, 32E, 41E, 42E corresponding to the IGBT emitter and a control contact 31G, 32G, 41G, 42G corresponding to the IGBT gate. The control contact 31G, 32G, 41G, 42G is arranged on the second face 31*b*, 32*b*, 41*b*, 42*b* of each IGBT 31, 32, 41, 42 in the form of a single central contact pad. The second power contact 31E, 32E, 41E, 42E is arranged on the second face 31*b*, 32*b*, 41*b*, 42*b* of each IGBT 31, 32, 41, 42 in the form of peripheral contact pads. Thus, FIGS. 3A and 3B show that each IGBT 31, 32, 41, 42 comprises 8 power contact pads 31E, 32E, 41E, 42E surrounding the single control contact pad 31G, 32G, 41G, 42G.

The first face 36*a*, 37*a*, 46*a*, 47*a* of each diode 36, 37, 46, 47 comprises a first power contact 36K, 37K, 46K, 47K forming a cathode. The first power contact 36K, 37K, 46K, 47K represents most of the surface of the first face 36*a*, 37*a*, 46*a*, 47*a* of the diode 36, 37, 46, 47. The second face 36*b*, 37*b*, 46*b*, 47*b* of each diode 36, 37, 46, 47 comprises a second power contact 36A, 37A, 46A, 47A forming an anode. The second power contact 36A, 37A, 46A, 47A represents most of the surface of the second face 36*b*, 37*b*, 46*b*, 47*b* of the diode 36, 37, 46, 47.

The layout of the first and second pairs 30, 40, 35, 45 of IGBTs and diodes is shown in FIGS. 1 and 2.

Thus, FIGS. 1 and 2 show that for the first pairs 30, 35 of IGBTs and diodes:

the first power contacts 31C, 36K of the first IGBT 31 and the first diode 36 are electrically connected together by a first power track 11,
the second power contacts 31E, 36A of the first IGBT 31 and the first diode 36 are electrically connected together by a second power track 22,
the control contact 31G of the first IGBT 31 is connected to a first control track 25,
the first power contacts 32C, 37K of the second IGBT 32 and the second diode 37 are connected together by a third power track 21,
the second power contacts 32E, 37A of the second IGBT 32 and the second diode 37 are electrically connected together by a fourth power track 12,
the control contact 32G of the first IGBT 32 is connected to a second control track 15.

Thus, the first and the second IGBT 31, 32 of the first pair of IGBTs 30 are installed in parallel in a redundant layout so that they operate in parallel with each other. In the same way, the first and the second diode 36, 37 of the first pair of diodes 35 are installed in parallel with a redundant layout so as to operate in parallel with each other.

Similarly as can be seen in FIGS. 1 and 2, for the second pairs 40, 45 of IGBTs 41, 42 and diodes 46, 47:

the first power contacts 41C, 46K of the first IGBT 41 and the first diode 46 are electrically connected together by a fifth power track 13,
the second power contacts 41E, 46A of the first IGBT 41 and of the first diode 46 are electrically connected together by a sixth power track 24,
the control contact 41G of the first IGBT 41 is connected to a third control track 26,
the first power contacts 42C, 47K of the second IGBT 42 and the second diode 47 are connected together by a seventh power track 23,
the second power contacts 42E, 47A of the second IGBT 42 and the second diode 47 are electrically connected together by an eighth power track 14,
the control contact 42G of the first IGBT 42 is connected to a fourth control track 16.

In this way, the first and the second IGBT 41, 42 of the second pair of IGBTs 40 are mounted in parallel in a redundant layout so that they operate in parallel with each other. In the same way, the first and the second diode 46, 47 of the second pair of diodes 45 are mounted in parallel with a redundant layout so as to operate in parallel with each other.

Such layouts of the first and second pairs 30, 40, 35, 45 of IGBTs 31, 32, 41, 42 and diodes 36, 37, 46, 47 are made using the first and the second electrical circuit of the first and second support 10, 20 respectively.

To achieve this and with reference to FIGS. 1 and 3A, the first electrical circuit of the first support 10 comprises first, fourth, fifth and eighth power tracks 11, 12, 13, 14 and the first and third control tracks 15, 16, on its inner face. The second circuit of the second support 12 comprises the second, third, sixth, seventh power tracks 21, 22, 23, 24 and the second and fourth control tracks 25, 26, as shown in FIGS. 1 and 3B.

Note that the first and eighth power tracks 11, 14 are connected to each other and are coincident to form a single track. Similarly, the second and seventh power tracks 21, 24 are connected to each other and are coincident to form a single track.

The first and fifth power tracks 11, 13 are arranged on the first support 10 such that an IGBT 31, 41 and a diode 36, 46 supported by their first face 31*a*, 41*a* electrically connected to them, the IGBT 31, 41 and the diode 36, 46 have their second power contact 31E, 41E, 36A, 46A facing a power track 22, 24 of the second support 20, and such that the IGBT 31, 41 has its control contact 31G, 41G facing a control track 25,26 of the second support 20. In other words, the first power track 11 faces the second power track 22 and the first control track 25 and the fifth power track 13 faces the sixth power track 24 and the third control track 26.

Thus, the first IGBTs 31, 41 and diodes 36, 46 of the first and second pairs of IGBTs 30, 40 and diodes 35, 45 by being supported by their first face 31*a*, 41*a*, 36*a*, 46*a* on the first support 10 connected to power tracks 21, 23 of this support, can easily be connected through their second face 31*b*, 41*b*, 36*b*, 46*b* to the electrical circuit of the second support 20. Such a connection may be provided by ball soldering 19, as shown in FIG. 1.

Similarly, the third and seventh power tracks 21, 23, are laid out on the second support 20 such that when an IGBT 32, 42 and a diode 37, 47 are supported by their first face electrically connected to the latter, the IGBT 32, 42 and the diode 37, 47 have their second power contact 32E, 42E, 37A, 47A facing the same power track 12, 13 of the first support 10 and the IGBT 32, 42 has its control contact 32G, 42G facing a control track 15, 16 of the first support 10. In other words, the third power track 21 has a track portion facing the fourth power track 12 and the second control track 15 and the seventh power track 23 has a track portion facing the eighth power track 14 and the fourth control track 16.

Thus, the second IGBTs 32, 42 and diodes 37, 47 of the first and second pairs of IGBTs 30, 40 and diodes 35, 45 being supported by their first face 32*a*, 42*a*, 37*a*, 47*a* on the second support 20 connected to the power tracks 21, 23 of this support can easily be connected by their second face 32*b*, 42*b*, 37*b*, 47*b* to the electrical circuit of the first support 10.

Note that the first and the eighth power tracks 11, 14 comprise a track portion facing the third and sixth power tracks 21, 24 respectively, to enable connection of the first and eighth power tracks 11, 14 of the first support 10 with the third et sixth power tracks 21, 24 of the second support 20. Similarly the fourth and the fifth power tracks 12, 13 comprise a track portion facing the second and seventh power tracks 22, 23 respectively, to enable a connection between the fourth and fifth power tracks 12, 13 of the first support 10 with the second and seventh power tracks 22, 23 respectively of the second support.

Thus, connections between the power tracks 11, 12, 13, 14, 21, 22, 23, 24 of the first and of the second support 10 20 may be made using a simple connection method such as ball soldering 19 as shown in FIG. 1.

Similarly, to enable simultaneous control of the first and second IGBTs 31, 41, 32, 42 of a single pair of IGBTs 30, 40, the first and the third control tracks 15, 16 each comprises a track portion facing the second and the fourth control track 25, 26 respectively. In this way, the first and the third control tracks 15, 16 may be connected to the second and fourth control tracks 25, 26 respectively by a simple connection method such as ball soldering as shown in FIG. 1.

Therefore with such a module, as shown in FIG. 1, the thermal contact area between the first component 31, 36, 41, 46 of each of the pairs 30, 35, 40, 45 and the first support 10 is larger than the thermal contact area with the second support 20. The thermal contact area on the first support 10 is provided by an attachment of the first face 31*a*, 36*a*, 41*a*, 46*a* of the first component 31, 37, 41, 47 on a power track of the first 11, 13 support 10 while it is provided by the thermal contact with the second support 20 by simple electrical connections such as solder balls 19. The result is that the thermal contact area of the first component 31, 36, 41, 46 of each pair 30, 35, 40, 45 with the first support 10 is generally 5 times or even 10 or more times larger than with the second support 20.

Conversely, and in the same manner, the second component 32, 37, 42, 47 of each pair 30, 35, 40, 45 has a larger thermal contact surface area with the second support 20 than the thermal contact surface area with the first support 10. Thus, the second component 32, 36, 42, 47 of each pair 30, 35, 40, 45 has a thermal contact surface area with the second support 20 that is generally 5 times or even 10 times larger than with the second support 10.

Figure 4:
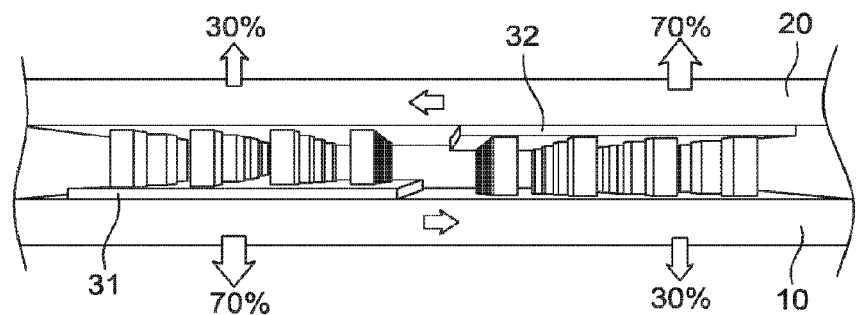

Since the first and the second components 31, 36, 41, 46, 32, 37, 42, 47 of a single pair 30, 35, 40, 45 operate in parallel as shown in FIG. 2, therefore as shown in FIG. 4, during operation, the quantity of heat transmitted through the first and second components 31, 36, 41, 46, 32, 37, 42, 47 to the first or the second support 10, 20 balances the quantity of heat transmitted by the other of the first and second components 31, 36, 41, 46, 32, 37, 42, 47 to the other of the first and second supports 10, 20. Thus, as shown in FIG. 4, the first and the second supports 10, 20 receive the same quantity of thermal energy. The result is that heat dissipation is approximately identical to heat dissipation in modules in which the components are thermally connected to the two supports 10, 20.

Figure 5A:
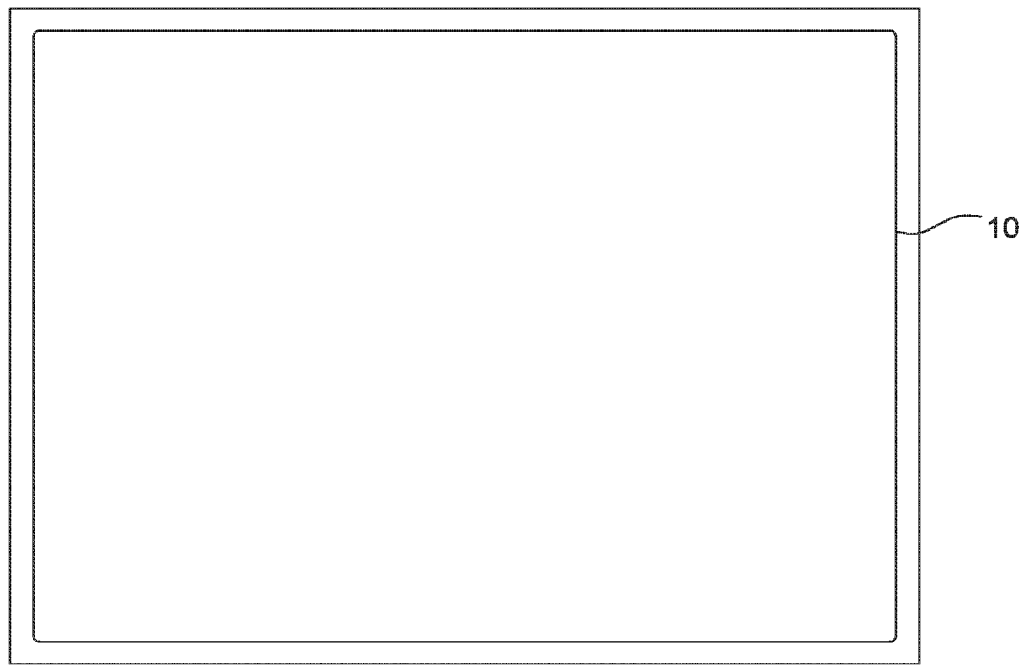
Figure 5B:
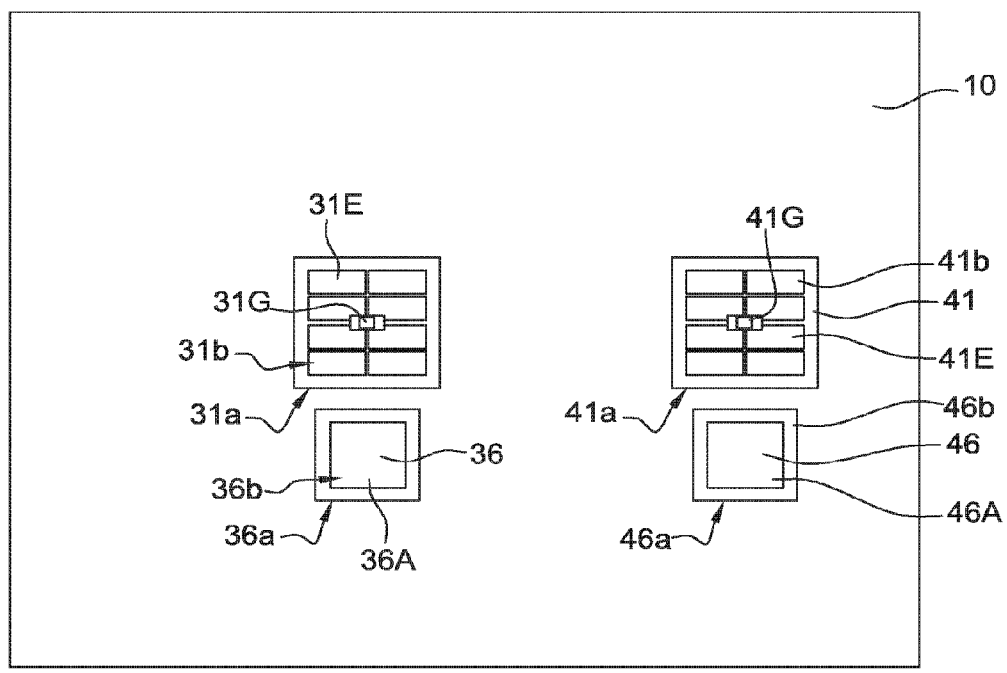
Figure 5C:
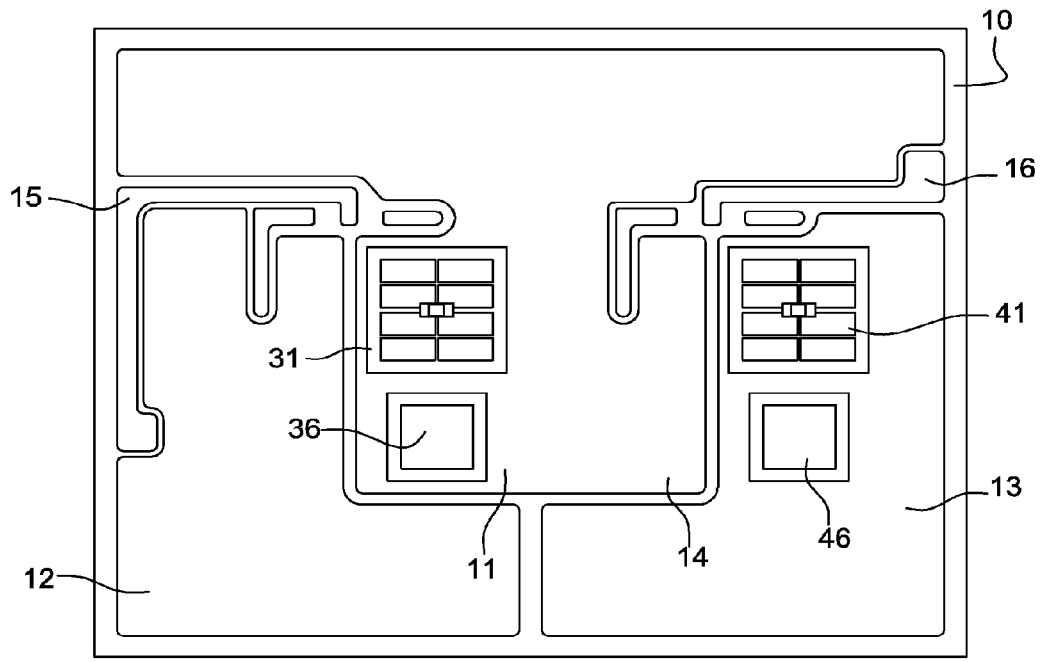
Figure 5D:
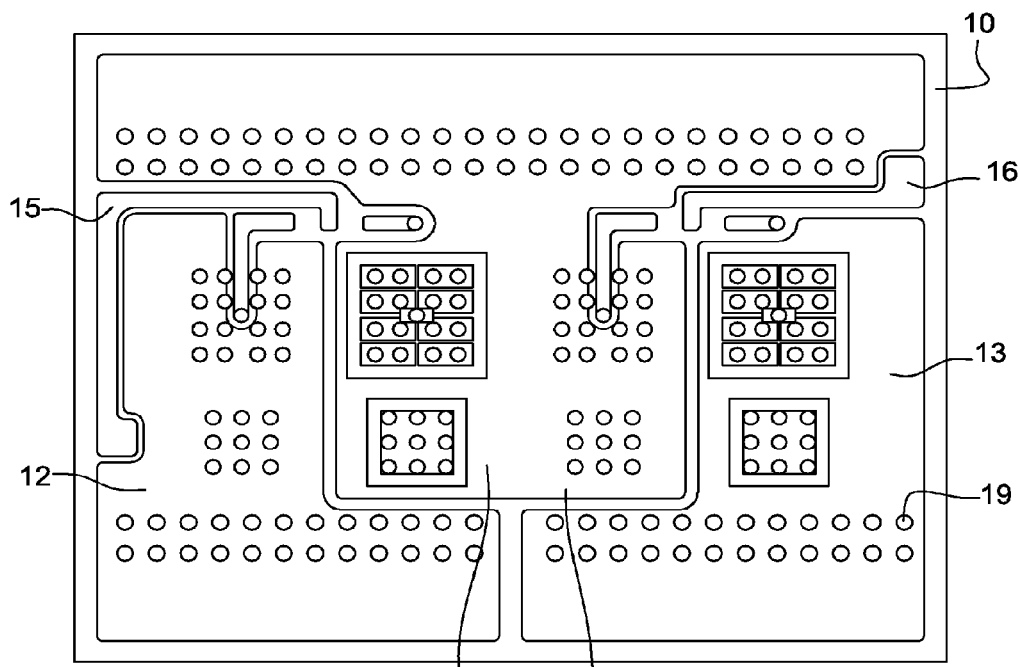

Such a module may be manufactured using a method comprising the following steps:

supply the first and the second supports 10, 20, each comprising a conducting face like that shown in FIG. 5A, in which conducting tracks such as power or control tracks may be formed, supply of power components 31, 32, 36, 37, 41, 42, 46, 47 in pairs 30, 35, 40, 45, attachment of the first face 31*a*, 32*a*, 36*a*, 37*a*, 41*a*, 42*a*, 46*a*, 47*a* of components 31, 32, 36, 37, 41, 42, 46, 47 onto the conducting face of supports 10, 20, with the first component 31, 36, 41, 46 of each pair 30, 35, 40, 45 attached to the first support 10 and the second component 32, 37, 42, 47 of each pair 30, 35, 40, 45 attached to the second support, as shown in FIG. 5B for the first support 10, formation of power and control tracks 11, 12, 13, 14, 15, 16, 21, 22, 23, 24, 25, 26 on the conducting face of each support 10, 20, as shown in FIG. 5C for the second support 20, formation of balls 19 for ball soldering, onto the second faces of the components and onto power and control tracks of supports, as shown in FIG. 5D, assembly of the first and the second support so as to bring the power and control tracks of the first support and the second support to face each other as can be seen in FIG. 1 before closing the module 1, heating to achieve ball soldering of components 31, 32, 36, 37, 41, 42, 46, 47 onto the power and control tracks 11, 12, 13, 14, 21, 22, 23, 24, 15, 16, 25, 26 of the support 10, 20 on which the components 31, 32, 36, 37, 41, 42, 46, 47 are not supported.

During the step to fasten the components through their first face onto the conducting face of the corresponding support, this attachment may be made equally well by brazing or by soldering. Thus, each component may be fixed to the support supporting it either by brazing material or by solder material.

Similarly, the method includes a step to position solder balls, to assemble the supports, and a heating step in which ball soldering is done. Nevertheless, without going outside the scope of the invention, it would also be possible to connect the components to the support that is not supporting them using a different method such as the use of solder bridges other than solder balls.

Note also that in the embodiment described above, although two pairs of IGBTs and two pairs of diodes are described, the principle of the invention can be applied to other types of modules comprising an arbitrary number of switches, with different components distributed in a different number of pairs. Thus, the invention can be applied to a module comprising a single pair of IGBTs or to modules with much more complex structures.

The invention claimed is:

1. A power electronic module comprising: a plurality of pairs of power electronic components each pair comprising at least a first power electronic component and a second power electronic component which are identical, a first support and a second support arranged approximately parallel to each other, the first support comprising a first electrical circuit and the second support comprising a second electrical circuit, the first power electronic component of each pair comprising a first face and a second face, the first power electronic component of each pair being supported by the first face on the first support in electrical contact with the first electrical circuit and being electrically connected to the second electrical circuit by the second face with a smaller thermal contact area than a contact area between the first face and the first support;

the second power electronic component of each pair comprising a third face and a fourth face, the second power electronic component of each pair being supported by the third face on the second support in electrical contact the second electrical circuit and being electrically connected to the first electrical circuit by the fourth face with a smaller thermal contact area than a contact area between the third face and the second support, the first power electronic component and the second power electronic component of each pair having a redundant arrangement, wherein the first power electronic component of at least one pair of the plurality of pair which comprises at least a first control contact and at least a first power contact and a second power contact, the first control contact being located on the second face of the first power electronic component of the at least one pair and at least the first power contact being located on the first face of the first power electronic component of the at least one pair, wherein the second power electronic component of the at least one pair comprises at least a second control contact and at least a third power contact and a fourth power contact, the second control contact being located on the fourth face of the second power electronic component of the at least one pair and at least the third power contact being located on the third face of the second power electronic component of the at least one pair, wherein the first electrical circuit includes at least one first high power circuit conducting track, and a first control conducting track, the second electrical circuit including at least one third high power circuit conducting track, and a second control conducting track, wherein the first power electronic component of the at least one pair is arranged on the first support with the first power contact of the first face in contact with the first high power circuit conducing track and with the first control contact connected to the third control conducting track, and second power electronic component of the at least one pair is arranged on the second support with the second power contact of the fourth face in contact with the first high power circuit conducting track and with the third control contact connected to the first control conducting track.

2. The power electronic module according to claim 1, wherein the first power electronic component of each pair have the second face connected to the second electrical circuit by means of solder bridges, the second power electronic component of each pair having the fourth face connected to the first electric circuit by means of other solder bridges.

3. The power electronic module according to claim 1, wherein the first face of the first power electronic component of each pair is to the first support by solder or brazing material, the third face of the second power electronic component of each pair being fixed to the second support by solder or brazing material.

4. The power electronic module according to claim 1, wherein the first control conducting track of the first support has a track portion facing the second power conducting track of the second support and in which the third control conducting track of the second support has a track portion facing the first high power circuit conducting track of the first support.

5. The power electronic module according to claim 4, wherein the first power electronic components of the at least one pair, has the second power contact arranged on the second face, the second power electronic components of the at least one pair having the fourth power contact arranged on the fourth face, wherein the first electrical circuit comprises at least one second high power circuit conducting track, the second electrical circuit comprising at least one fourth high power circuit conducing track, wherein the first power electronic component of the at least one pair, has the second control contact connected to the fourth high power circuit conducting track, the second power electronic component of the at least one pair having the fourth control contact connected to the second high power circuit conducting track.

6. The power electronic module according to claim 5, wherein the second high power circuit conducting track comprises a track portion facing the second control conducting track, the fourth high power circuit conducting track comprising a track portion facing the first control conducing track.

* * * * *